United States Patent
Kim et al.

(10) Patent No.: US 10,194,521 B2
(45) Date of Patent: Jan. 29, 2019

(54) HEAT DISSIPATION APPARATUS AND ELECTRONIC DEVICE INCLUDING THE SAME

(71) Applicant: Samsung Electronics Co., Ltd., Gyeonggi-do (KR)

(72) Inventors: Kyuwon Kim, Daegu (KR); Jeeyoung Jung, Seoul (KR); Jongkil Park, Gyeonggi-do (KR); Byungsu Lee, Daegu (KR); Jiwoo Lee, Gyeongsangbuk-do (KR)

(73) Assignee: Samsung Electronics Co., Ltd (KR)

( * ) Notice: Subject to any disclaimer, the term of this patent is extended or adjusted under 35 U.S.C. 154(b) by 19 days.

(21) Appl. No.: 15/616,420

(22) Filed: Jun. 7, 2017

(65) Prior Publication Data
US 2018/0035528 A1 Feb. 1, 2018

(30) Foreign Application Priority Data
Aug. 1, 2016 (KR) .................. 10-2016-0098170

(51) Int. Cl.
| | |
|---|---|
| H05K 1/02 | (2006.01) |
| H04M 1/02 | (2006.01) |
| H05K 9/00 | (2006.01) |
| H02J 7/02 | (2016.01) |
| H05K 5/00 | (2006.01) |
| G06F 1/20 | (2006.01) |
| H05K 7/20 | (2006.01) |

(52) U.S. Cl.
CPC ............ *H05K 1/0203* (2013.01); *G06F 1/20* (2013.01); *H02J 7/025* (2013.01); *H04M 1/0262* (2013.01); *H05K 1/028* (2013.01); *H05K 5/0017* (2013.01); *H05K 7/20127* (2013.01); *H05K 9/0033* (2013.01)

(58) Field of Classification Search
CPC .................................................... H04M 1/0262
See application file for complete search history.

(56) References Cited

U.S. PATENT DOCUMENTS

| | | | |
|---|---|---|---|
| 5,504,605 A | 4/1996 | Sakuma et al. | |
| 6,333,847 B1 * | 12/2001 | Katsui | G06F 1/203 361/625 |
| 6,545,866 B2 * | 4/2003 | Katsui | G06F 1/203 165/80.3 |
| 9,547,344 B2 * | 1/2017 | Han | G06F 1/203 |
| 9,582,051 B2 * | 2/2017 | Jang | G06F 1/203 |
| 9,735,826 B2 * | 8/2017 | Sohn | H04B 1/3888 |

(Continued)

FOREIGN PATENT DOCUMENTS

KR 1020140031358 3/2014

*Primary Examiner* — Robert J Hoffberg
(74) *Attorney, Agent, or Firm* — The Farrell Law Firm, P.C.

(57) ABSTRACT

A heat dissipation apparatus and electronic device including the same are provided. The heat dissipation apparatus includes a battery area, a heat generation body including a shield can and a PCB on which heat generating components are mounted, an internal support structure disposed adjacent to the heat generation body, and a coil FPCB attached between the internal support structure and the shield can, wherein the internal support structure includes an air volume space configured to block conduction of high-temperature heat produced by the heat generation body and cause thermal radiation and convection.

20 Claims, 19 Drawing Sheets

(56) References Cited

U.S. PATENT DOCUMENTS

| | | | |
|---|---|---|---|
| 9,787,809 B2* | 10/2017 | Jeong | H04M 1/0277 |
| 9,795,069 B2* | 10/2017 | Waffenschmidt | H01F 27/365 |
| 9,836,100 B2* | 12/2017 | Han | G03B 17/55 |
| 9,910,468 B2* | 3/2018 | Yang | G06F 1/1626 |
| 2008/0094787 A1* | 4/2008 | Kabeya | G06F 1/1613 |
| | | | 361/679.01 |
| 2014/0102678 A1* | 4/2014 | Zou | H05K 5/0213 |
| | | | 165/135 |
| 2015/0349406 A1* | 12/2015 | Jung | H05K 7/2039 |
| | | | 343/702 |
| 2016/0029511 A1* | 1/2016 | Jung | F28F 23/00 |
| | | | 361/700 |
| 2017/0047791 A1* | 2/2017 | Jang | H02J 50/90 |
| 2017/0155746 A1* | 6/2017 | Yang | H04M 1/026 |
| 2018/0120911 A1* | 5/2018 | Han | G03B 17/55 |
| 2018/0150115 A1* | 5/2018 | Yang | G06F 1/1626 |
| 2018/0166809 A1* | 6/2018 | Brogan | H01R 12/714 |
| 2018/0199462 A1* | 7/2018 | Min | H05K 7/2039 |
| 2018/0217006 A1* | 8/2018 | Choi | G01K 5/52 |

* cited by examiner

HEAT DISSIPATION APPARATUS AND ELECTRONIC DEVICE INCLUDING THE SAME

PRIORITY

This application claims priority under 35 U.S.C. § 119(a) to Korean Patent Application Serial No. 10-2016-0098170, which was filed on Aug. 1, 2016, in the Korean Intellectual Property Office, the entire content of which is incorporated herein by reference.

BACKGROUND

1. Field of the Disclosure

The present disclosure generally relates to an electronic device, and more particularly, to a heat dissipation structure that contributes to heat dissipation and reduced weight of an electronic device.

2. Description of the Related Art

With rapid advances in electronics and communication technologies, the use of electronic devices such as mobile terminals, smartphones, electronic organizers, personal digital assistants, televisions and laptop computers has become widespread and has served as an important means for rapid information dissemination.

A thin electronic device may include a high-end application processor (AP), a power charging circuit for power supply or battery charging, and a radio frequency (RF) circuit for communication with an external device. When such components operate, the electronic device may consume a significant amount of current and generate a large amount of heat.

When the user holds or grips an electronic device, as the bottom surface or the cover of the electronic device directly contacts the hand of the user, the user may directly feel the heat generated by the electronic device.

In an electronic device such as a mobile communication terminal, the main board where various electronic components (the application processor (AP) in particular) are mounted is a major heat source. To dissipate heat generated by a heat generating component, a thermal interface material (TIM) may be attached to the surface of the heat generating component. However, as TIMs tend to be expensive, the use of TIMs may increase the cost of the electronic device.

Analyzing the electronic device using a thermal imaging camera may show that a large temperature difference exists at the boundary surface between the mainboard portion (where a large amount heat is generated) and the battery pack portion (where the temperature is relatively low) in the main body of the electronic device.

It is possible to enhance heat dissipation efficiency of the electronic device without degrading performance of the antenna mounted inside the electronic device or at the battery pack by maximizing the area of a heat dissipation sheet and utilizing a heat dissipation connector to transfer heat from a heat generating portion to an area where the antenna is not disposed.

SUMMARY

Accordingly, an aspect of the present disclosure is to provide a heat dissipation apparatus and electronic device including the same that may lower the temperature on a surface of a heat-generating hot spot area while reducing the weight of the electronic device by enhancing a heat dissipation structure to prevent a rapid increase in the temperature of the surface of the electronic device due to heat generated by components on the PCB and to restrict the spread of the hot spot area over time.

In accordance with an aspect of the present disclosure, a heat dissipation apparatus for an electronic device is provided which includes a battery area, a heat generation body including a shield can and a PCB on which heat generating components are mounted, an internal support structure disposed adjacent to the heat generation body, and a coil flexible printed circuit board (FPCB) attached between the internal support structure and the shield can, wherein the internal support structure includes an air volume space configured to block conduction of heat produced by the heat generation body and cause thermal radiation and convection.

In accordance with another aspect of the present disclosure, an electronic device including a heat dissipation apparatus is provided. The heat dissipation apparatus includes a battery area, a heat generation body including a shield can and a PCB on which heat generating components are mounted, an internal support structure disposed adjacent to the heat generation body, and a coil FPCB attached between the internal support structure and the shield can, wherein the internal support structure is configured to reduce a hot spot area.

In accordance with another aspect of the present disclosure, an electronic device is provided which includes a housing including a first face and a second face facing the opposite direction of the first face a touchscreen display exposed through at least a portion of the first face, a middle plate disposed between the touchscreen display and the second face, a plurality of electronic components arranged between the middle plate and the second face and producing heat during operation, a thermally conductive sheet disposed between the middle plate and the second face to diffuse heat produced by the plurality of electronic components, and a printed circuit board (PCB) disposed between the middle plate and the thermally conductive sheet so as to partially overlap the thermally conductive sheet when viewed from above the second face, wherein at least one of a substance whose thermal conductivity is lower than that of the substrate of the PCB and air is contained between the plurality of electronic components and the thermally conductive sheet.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
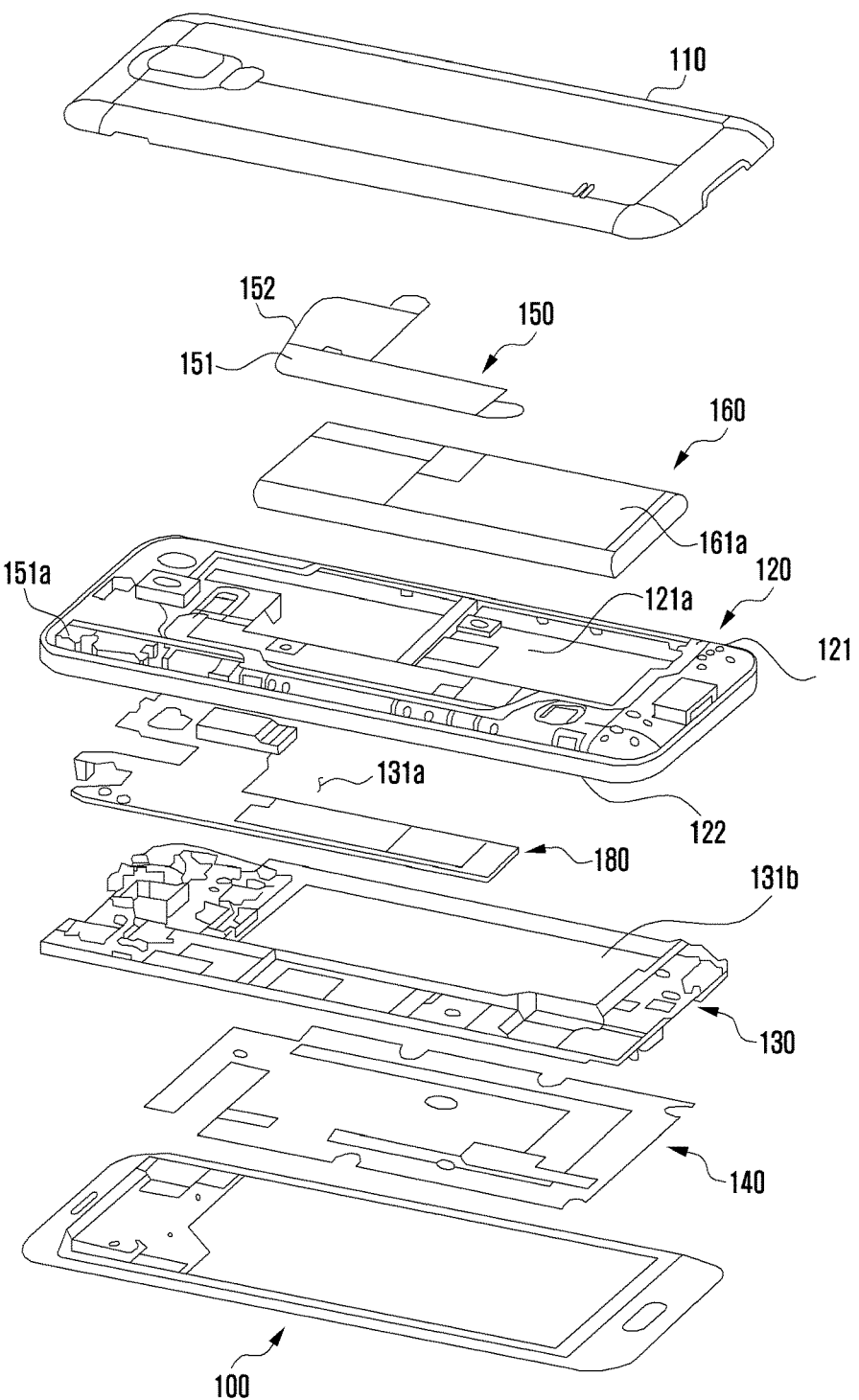
FIG. 1 is an exploded perspective view of an electronic device including a heat dissipation apparatus according to an embodiment of the present disclosure.

The expressions "include" and "may include" as used in the present disclosure denote the presence of the disclosed functions, operations, and constituent elements and do not limit one or more additional functions, operations, and constituent elements. In the present disclosure, the terms "include" and/or "have" may be construed to denote a certain characteristic, number, step, operation, constituent element, component or a combination thereof, but may not be construed to exclude the existence of or a possibility of the addition of one or more other characteristics, numbers, steps, operations, constituent elements, components or combinations thereof.

In the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," etc., may modify various elements. However, such elements are not limited by the above expressions. For example, the above expressions do not limit the sequence and/or importance of the elements. The above expressions are used to distinguish an element from the other elements. A first user device and a second user device indicate different user devices although both of them are user devices. A first element may be referred to as a second element, and similarly, a second element may be referred to as a first element without departing from the scope of the present disclosure.

In the case where a component is referred to as being "connected to" or "accessed by" another component, it should be understood that not only the component is directly connected to or accessed by the other component, but also there may exist another component between them. In the case where a component is referred to as being "directly connected to" or "directly accessed by" another component, it should be understood that there is no component therebetween. The terms used in the present disclosure are only used to describe certain embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to an embodiment of the present disclosure may be a device including a communication function. For example, the device corresponds to at least one of a smartphone, a tablet personal computer (PC), a mobile phone, a video phone, an e-book reader, a desktop PC, a laptop PC, a netbook computer, a personal digital assistant (PDA), a portable multimedia player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a television (TV), a digital video disk (DVD) player, an audio device, various medical devices (for example, magnetic resonance angiography (MRA), magnetic resonance imaging (MRI), computed tomography (CT), a scanning machine, a ultrasonic wave device, or the like), a navigation device, a global positioning system (GPS) receiver, an event data recorder (EDR), a flight data recorder (FDR), a set-top box, a TV box (for example, Samsung HomeSync™, Apple TV™, or Google TV™), an electronic dictionary, a vehicle infotainment device, an electronic equipment for a ship (for example, navigation equipment for a ship, a gyrocompass, or the like), avionics, a security device, electronic clothes, an electronic key, a camcorder, game consoles, a head-mounted display (HMD), a flat panel display device, an electronic frame, an electronic album, furniture or a portion of a building/structure that includes a communication function, an electronic board, an electronic signature receiving device, a projector, and the like. The electronic device according to an embodiment of the present disclosure is not limited to the aforementioned devices.

FIG. 1 is an exploded perspective view of an electronic device including a heat dissipation apparatus according to an embodiment of the present disclosure.

In the present disclosure, a mobile communication terminal is used as a representative example of the electronic device. Referring to FIG. 1, the terminal includes a display module 100, and a back cover 110 on the back of the terminal. The terminal further includes, between the display module 100 and the back cover 110, a PCB 180 where various electronic components are mounted, a housing 120 serving as an internal support structure, and one or more heat dissipation sheets 140 and 150. The back cover 110 includes a cover glass 112.

The housing 120 includes a first face 122 facing the display module 100 and a second face 121 facing the opposite direction of the display module 100. Here, the first face 122 is the front face of the housing 120 and the second face 121 is the rear face of the housing 120. The housing 120 may be regarded as a rear case and may serve as a basic frame supporting various mounted electronic components. The housing 120 includes one or more metal patterns 151a and 161a, and may include a space to hold a component including at least one metal pattern. At least one metal pattern inside the housing 120 may be an antenna pattern, and the component may be a battery pack 160. The metal pattern may be arranged on the battery pack 160, and the metal pattern 161*a* may be placed on a side of the battery pack 160. The metal pattern 161*a* may be an antenna for short-range wireless communication such as near field communication (NFC).

The housing 120 further includes a device ejector frame 130 serving as an internal bracket to support the PCB and various electronic components. The PCB 180 may be arranged between the housing 120 and the device ejector frame 130. The housing 120, the PCB 180 and the device ejector frame 130 may be combined into a stacked structure to thereby support various electronic components. The housing 120, the PCB 180 and the device ejector frame 130 have openings 121*a*, 131*a* and 131*b*, respectively, to accommodate the battery pack 160.

The heat dissipation sheets may include first and second heat dissipation sheets 140 and 150. The first heat dissipation sheet 140 may be arranged between the display module 100 and the first face 122 of the housing 120 so as to transfer heat from a heat source to a low temperature area. In the terminal, the AP and light emitting diodes (LEDs) mounted on the PCB may be regarded as a heat source, and the AP may be the highest temperature heat source.

The second heat dissipation sheet 150 may be arranged between the second face 121 of the housing 120 and the back cover 110. The second heat dissipation sheet 150 may be attached to or embedded in the back cover 110 so as not to overlap the metal pattern 161*a*. The second heat dissipation sheet 150 may include a first portion 151 located near the heat source and a second portion 152 extended from the first portion 151. The first portion 151 may be extended from the second heat dissipation sheet 150 so as not to overlap at least the metal pattern 161*a*. The second portion 152 may transfer the heat from the heat source to another component, for example, one side of the battery pack 160 where the metal pattern 161*a* is not arranged.

At least one of the first heat dissipation sheet 140 and the second heat dissipation sheet 150 may be made of one or more of natural graphite particles, compressed exfoliated graphite particles, artificial graphite particles, copper, graphene particles, carbon nanotubes, and graphene hybrids.

Figure 2:
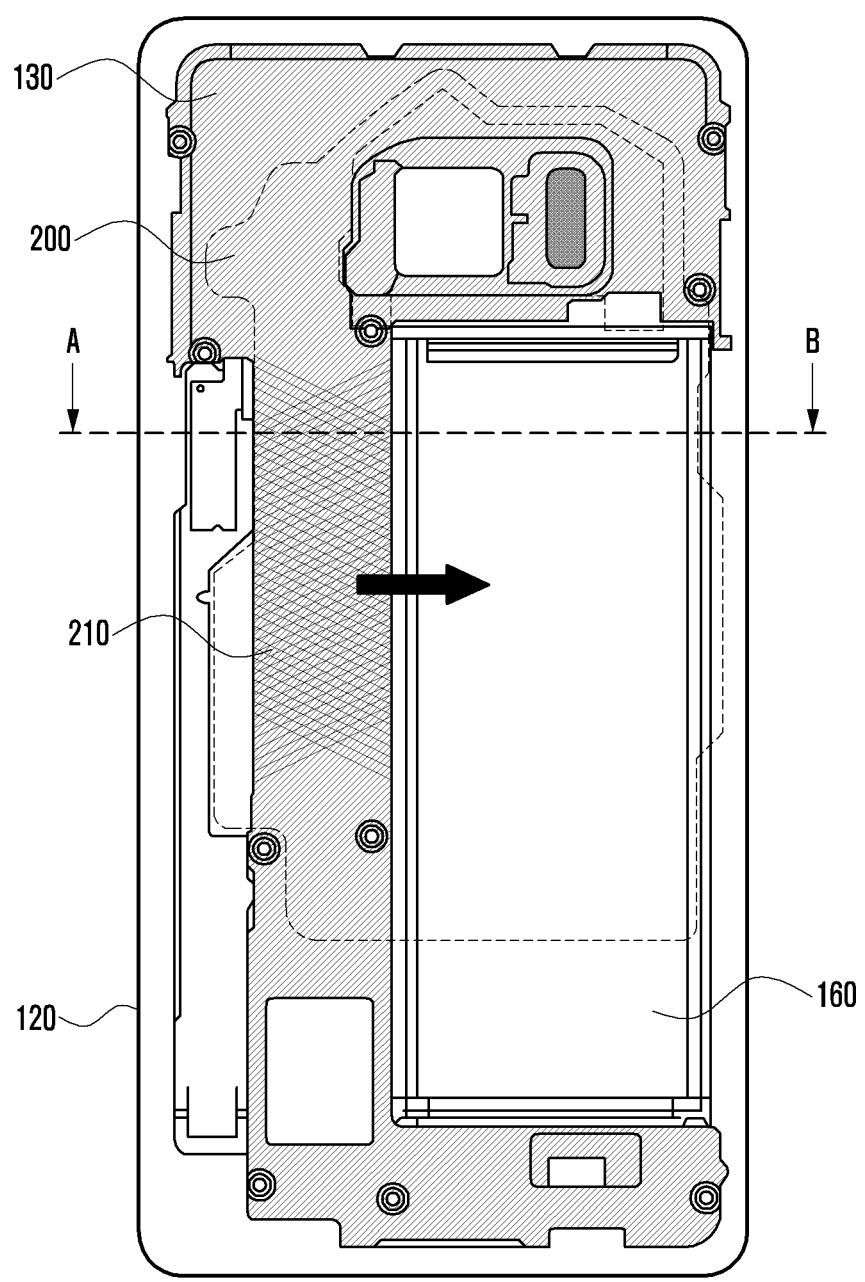
FIG. 2 is a top plan view of a heat dissipation structure of an electronic device according to an embodiment of the present disclosure.

FIG. 2 is a top plan view of a heat dissipation structure of an electronic device according to an embodiment of the present disclosure.

Figure 3:
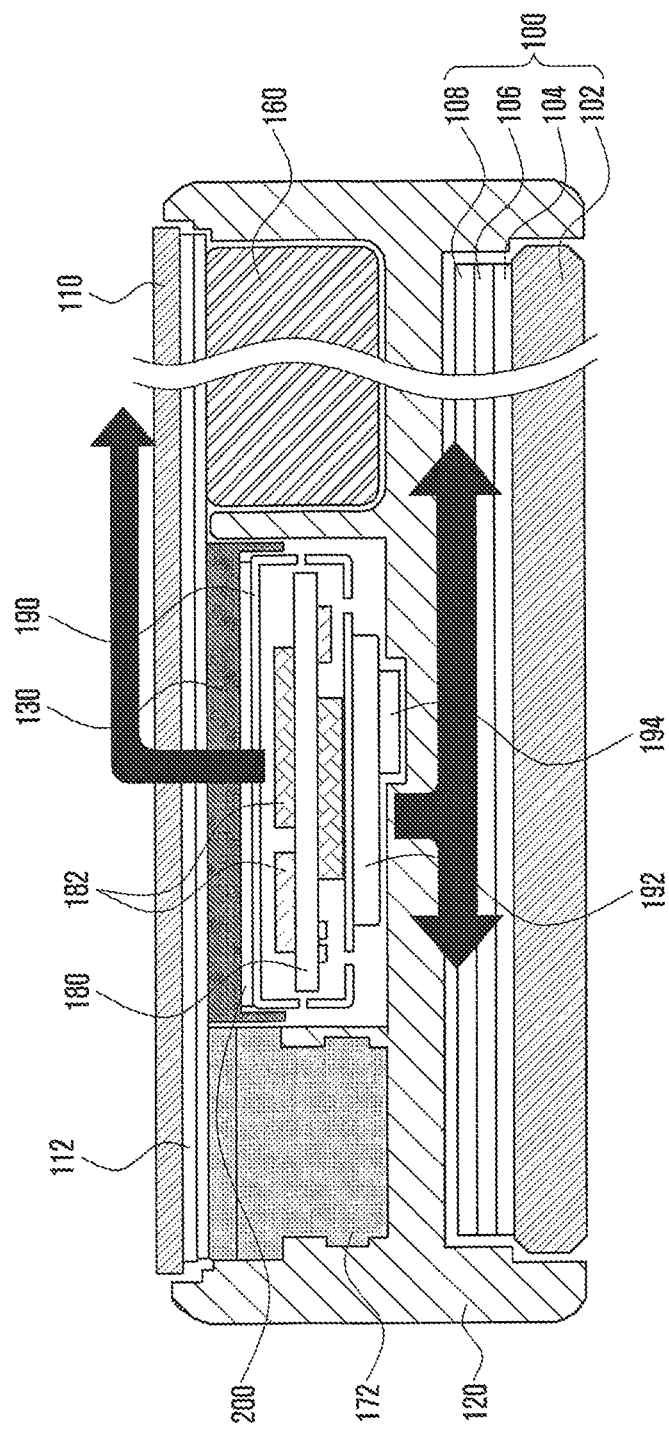
FIG. 3 is a cross-sectional view taken along line A-B of FIG. 2 according to an embodiment of the present disclosure.

FIG. 3 is a cross-sectional view taken along line A-B of FIG. 2 according to an embodiment of the present disclosure. FIGS. 2 and 3 illustrate a heat dissipation apparatus of a flat heat dissipation structure when the back cover 110 of the electronic device is not shown.

Referring to FIGS. 1 to 3, the housing 120 as an internal support structure includes the display module 100 arranged on the first face 122 (lower portion) thereof. The display module 100 includes a digitizer panel 108, a display panel 106, a touch screen panel (TSP) 104, and a window cover 102, which are stacked in sequence from the first face 122.

The back cover 110 may be arranged on the second face 121 (upper portion) of the housing 120. Between the second face 121 and the back cover 110, a pen duct 172 and a coil FPCB 200 (on the pen duct 172) may be disposed at one end, the battery pack 160 may be disposed at the opposite end, and a heating element producing heat may be disposed between the pen duct 172 and the battery pack 160. The PCB 180 where heat generating components 182 are mounted as a heat source may be embedded in a shield can 190. To distribute or reduce heat, a thermal interface material (TIM) 192 and a heat pipe 194 with a high thermal conductivity may be attached to the lower portion of the shield can 190.

In an embodiment of the present disclosure, the device ejector frame 130 may be included in the area where the PCB 180, the heat generating components 182 inside the PCB 180, and the shield can 190 are arranged. The coil FPCB 200 of a combination-type (combo-type), where functions such as wireless power charging (WPC), magnetic secure transmission (MST) and NFC are executed, may be attached between the device ejector frame 130 and the shield can 190 by using the device ejector frame 130 as a support structure.

Figure 4:
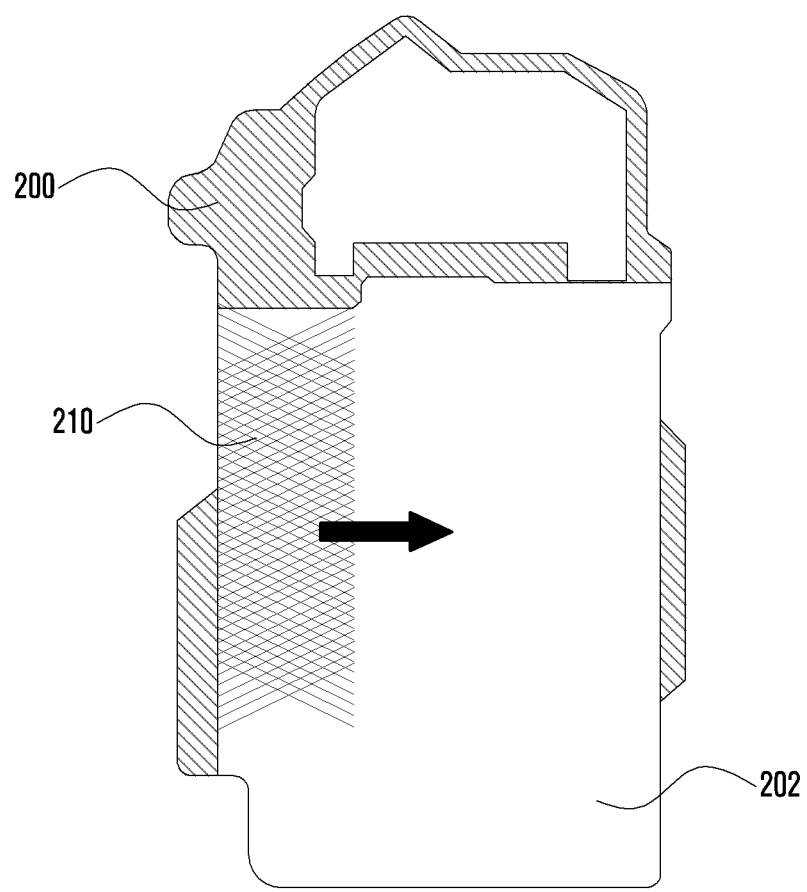
FIG. 4 illustrates heat conduction in the cross-section of FIG. 3 according to an embodiment of the present disclosure.

FIG. 4 illustrates heat conduction in the cross-section of FIG. 3 according to an embodiment of the present disclosure.

Referring to FIG. 4, in an embodiment of the present disclosure, a heat diffusion sheet 202 such as a graphite sheet may be attached to the bottom surface of the coil FPCB 200, which may include an antenna pattern constituting a combo coil antenna.

The heat diffusion sheet 202 and the antenna pattern are thermal conductors and may conduct heat from the heat generating components 182 mounted on the PCB 180 to a low-temperature battery area or a metal frame in the direction indicated by the thick arrow of FIG. 2.

Referring to FIGS. 2 and 4, the heat produced by the PCB 180, the heat generating components 182 mounted on the PCB 180 and the shield can 190 may create a heating area 210 as indicated by the cross hatched portion. In the heat dissipation apparatus of the present disclosure, the graphite heat diffusion sheet 202 and the antenna pattern of the combo coil FPCB 200 may diffuse the heat of the heating area 210 to different areas with a low temperature in directions indicated by the arrows of FIGS. 2 to 4, thereby suppressing the generation of a hot spot area (e.g. heating area 210).

When the rate of thermal conduction of heat from the hot spot area to low-temperature areas is low in comparison to the temperature rise in the hot spot area, it may not be possible to suppress hot spot generation. In addition, the cross-sectional structure for heat dissipation stacked on heat generating components may act as a medium that directly transfers the heat produced by the heat generating components 182 to the surface of the terminal (e.g. cover glass 112 of the back cover 110). As the shield can 190, the device ejector frame 130 made of plastic, the combo coil FPCB 200, and the cover glass 112 stacked on the hot spot of the heat generating components 182 may act as thermal conductors and thermal resistors for heat diffusion, the temperature of the hot spot may undesirably rise to a temperature of 100° F. (38° C.) in five or six minutes. A more detailed description of heat diffusion is provided below with reference to FIGS. 12*a* and 13A.

Figure 5:
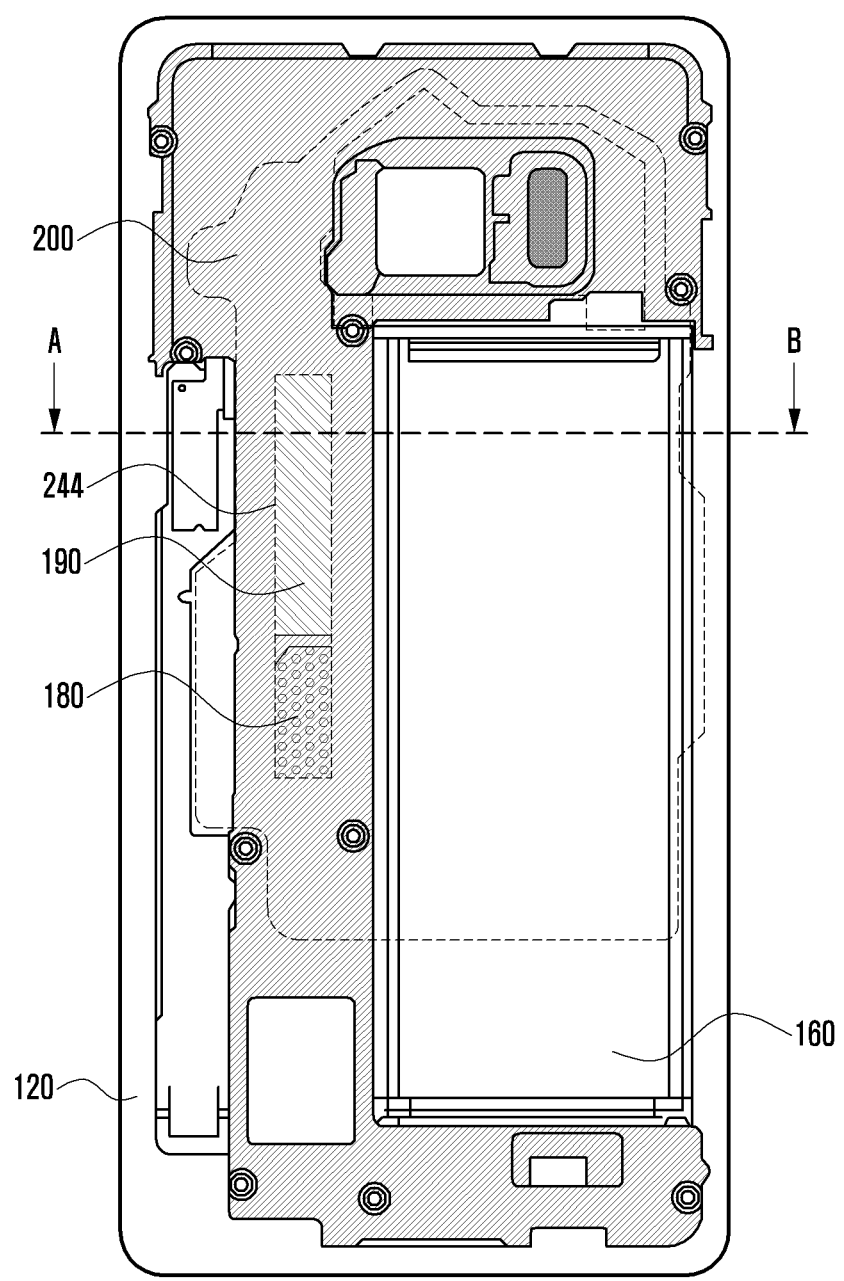
FIG. 5 is a top plan view of a heat dissipation structure of an electronic device according to an embodiment of the present disclosure.
Figure 6:
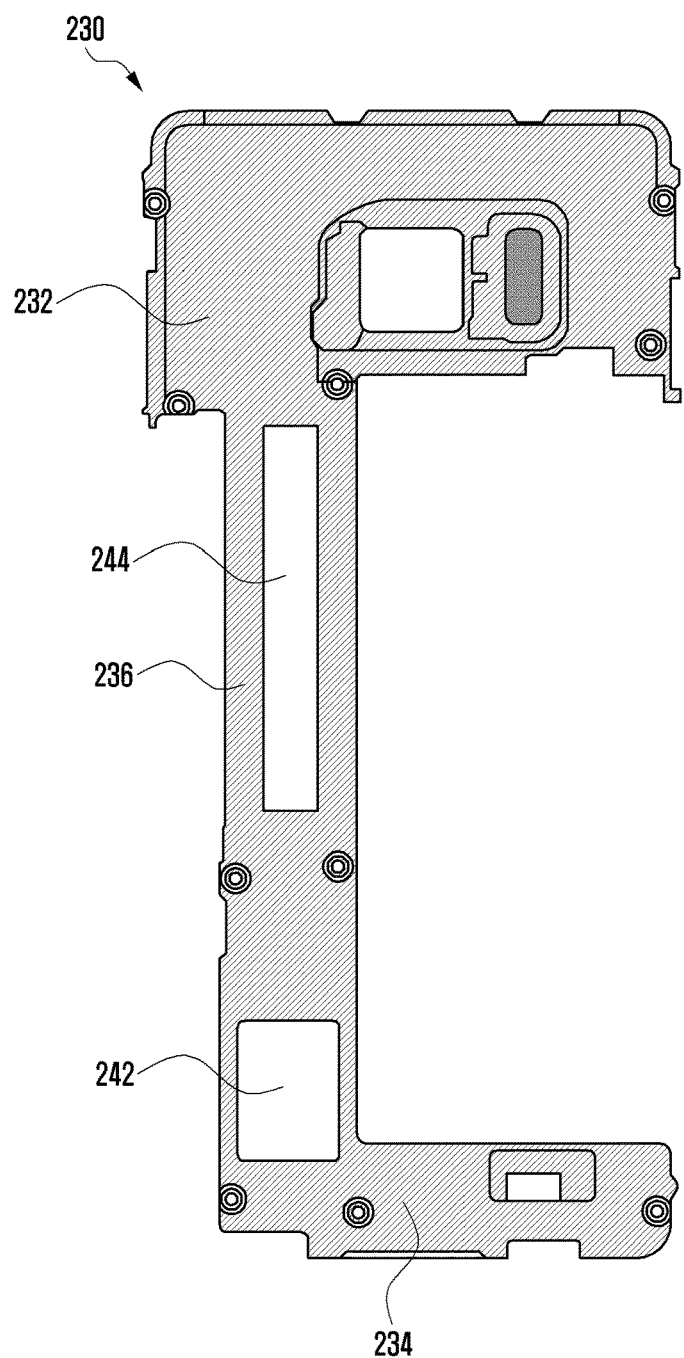
FIG. 6 is a top plan view of a frame of a heat dissipation apparatus according to an embodiment of the present disclosure.
Figure 7:
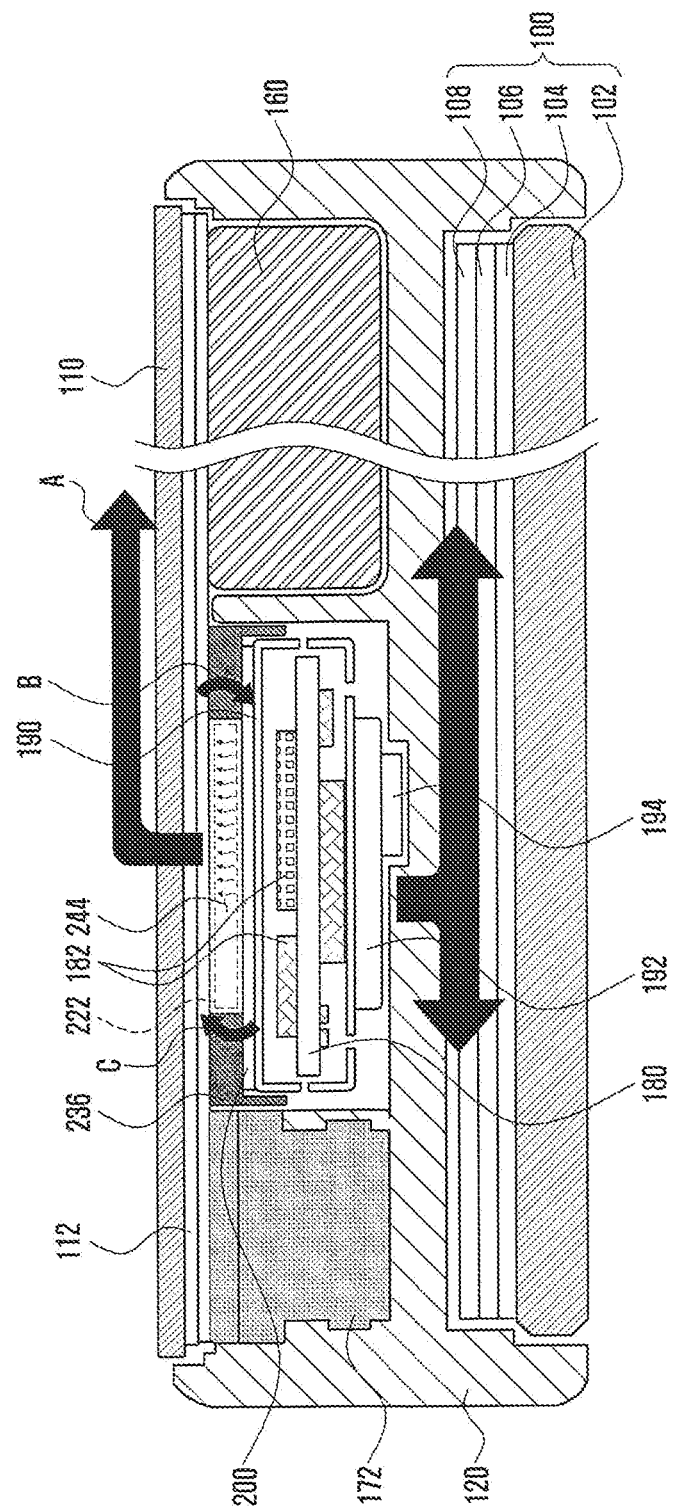
FIG. 7 is a cross-sectional view of a heat dissipation structure according to an embodiment of the present disclosure.

FIG. 5 is a top plan view of a heat dissipation structure of an electronic device according to an embodiment of the present disclosure. FIG. 6 is a top plan view of a frame of a heat dissipation apparatus according to an embodiment of the present disclosure. FIG. 7 is a cross-sectional view of a heat dissipation structure according to an embodiment of the present disclosure.

Referring to FIGS. 5 to 7, the heat dissipation apparatus includes a PCB 180, heat generating components 182 mounted on the PCB 180, and a device ejector frame 230 disposed in at least a portion of the area where the shield can 190 is positioned. The device ejector frame 230 includes an upper frame 232, a lower frame 234, and a link frame 236 vertically connecting the upper frame 232 and one side of the lower frame 234. The upper frame 232, the lower frame 234, and the link frame 236 may be formed as a single piece.

The upper frame 232 may support a first camera, an illuminance sensor, and a proximity sensor arranged in the upper region of the front face of the electronic device, and support a second camera, flash, and a speaker arranged in the rear face. The lower frame 234 may support a home button, a menu button, and a back button arranged in the lower region of the electronic device.

The link frame 236 may include a first opening 242 at the lower portion, and further include a second opening 244 to diffuse heat produced by the PCB 180, heat generating components 182 on the PCB 180, and the shield can 190. The first opening 242 and the second opening 244 may be vertically positioned respectively at the lower portion and the upper portion of the link frame 236. Here, the position of the second opening 244 may correspond to the heating area 210 due to the heat produced by the PCB 180, heat generating components 182 on the PCB 180, and the shield can 190. As shown in FIGS. 6 and 7, due to the formation of the second opening 244 in the device ejector frame 230, the heat dissipation apparatus of the present disclosure may include the heating area 210 corresponding to the second opening 244 and may expose the PCB 180 and the shield can 190 through the second opening 244. A sharp temperature rise in the terminal surface due to heat generated by the heat generating components 182 on the PCB 180 is prevented. Expansion of the hot spot area arising at a later time is suppressed by blocking a portion of the heat conduction path (indicated by arrow A) or by reducing the rate of heat conduction.

As shown in FIG. 7, formation of the second opening 244 in the link frame 236 of the device ejector frame 230 may create an air volume space 222 corresponding to the area of the second opening 244 between the shield can 190 and the cover glass 112. The air volume space 222 may block direct conduction of the heat generated by the heat generating components 182 mounted on the PCB 180, and heat radiation and convection may occur in the air volume space 222 (indicated by arrows B and C).

Referring to FIGS. 6 and 7, the air volume space 222 may have a volume of, for example, 1.57 cc, and the second opening 244 may somewhat reduce the weight of the terminal in accordance with its size.

Figure 8A:
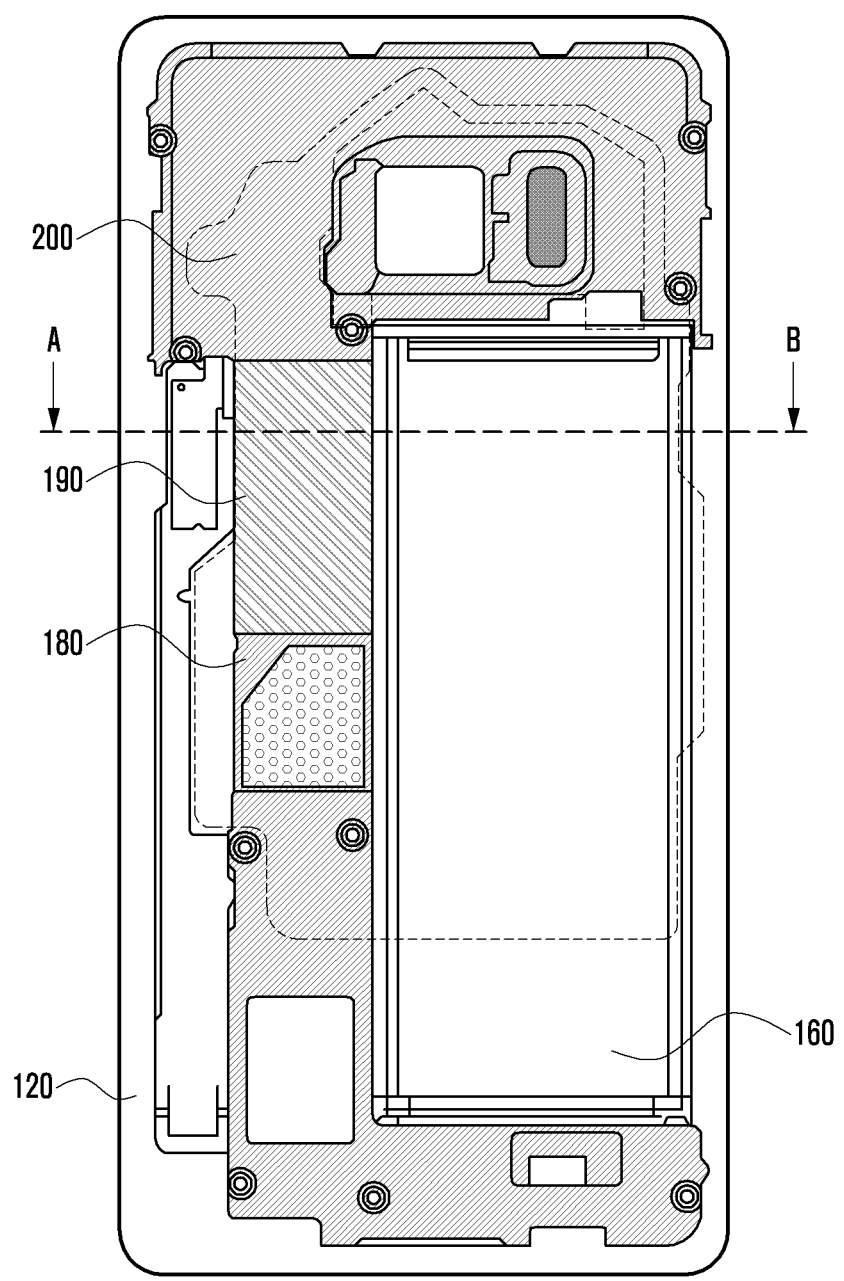
FIGS. 8A and 8B are top plan views of a heat dissipation structure and a frame of an electronic device according to an embodiment of the present disclosure.
Figure 8B:
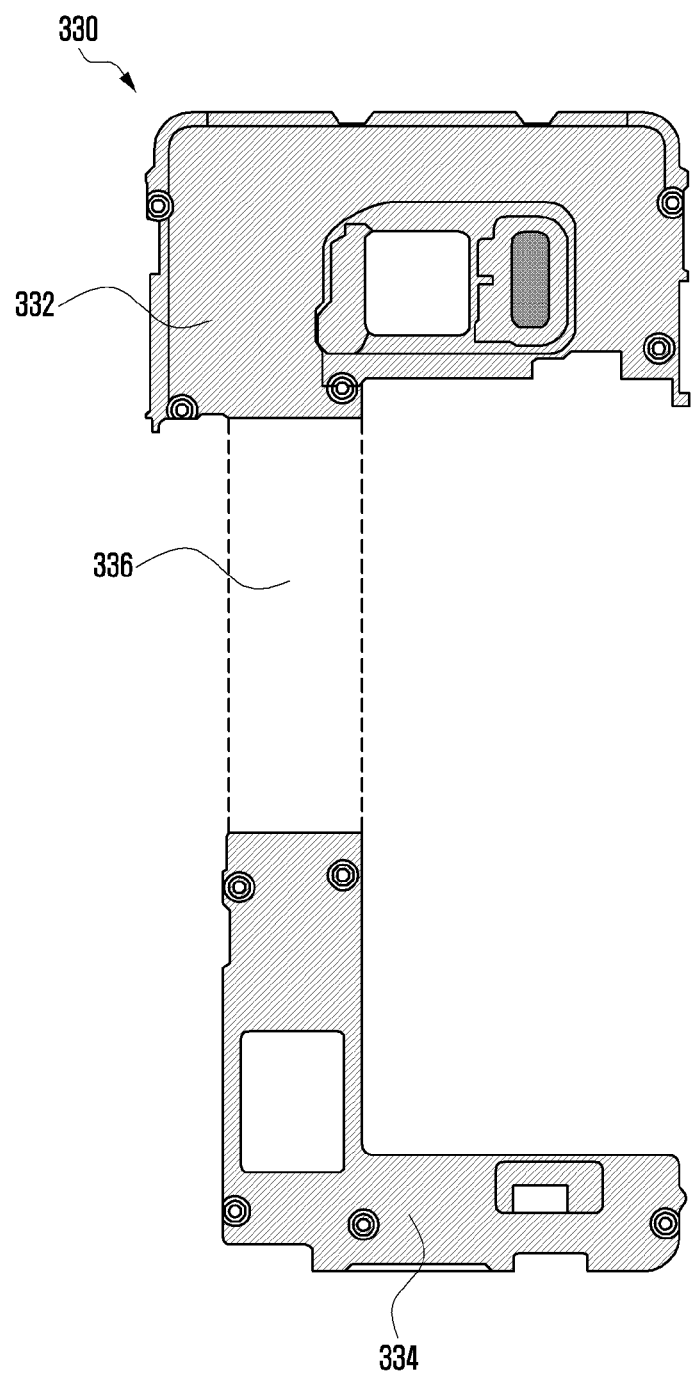
Figure 9:
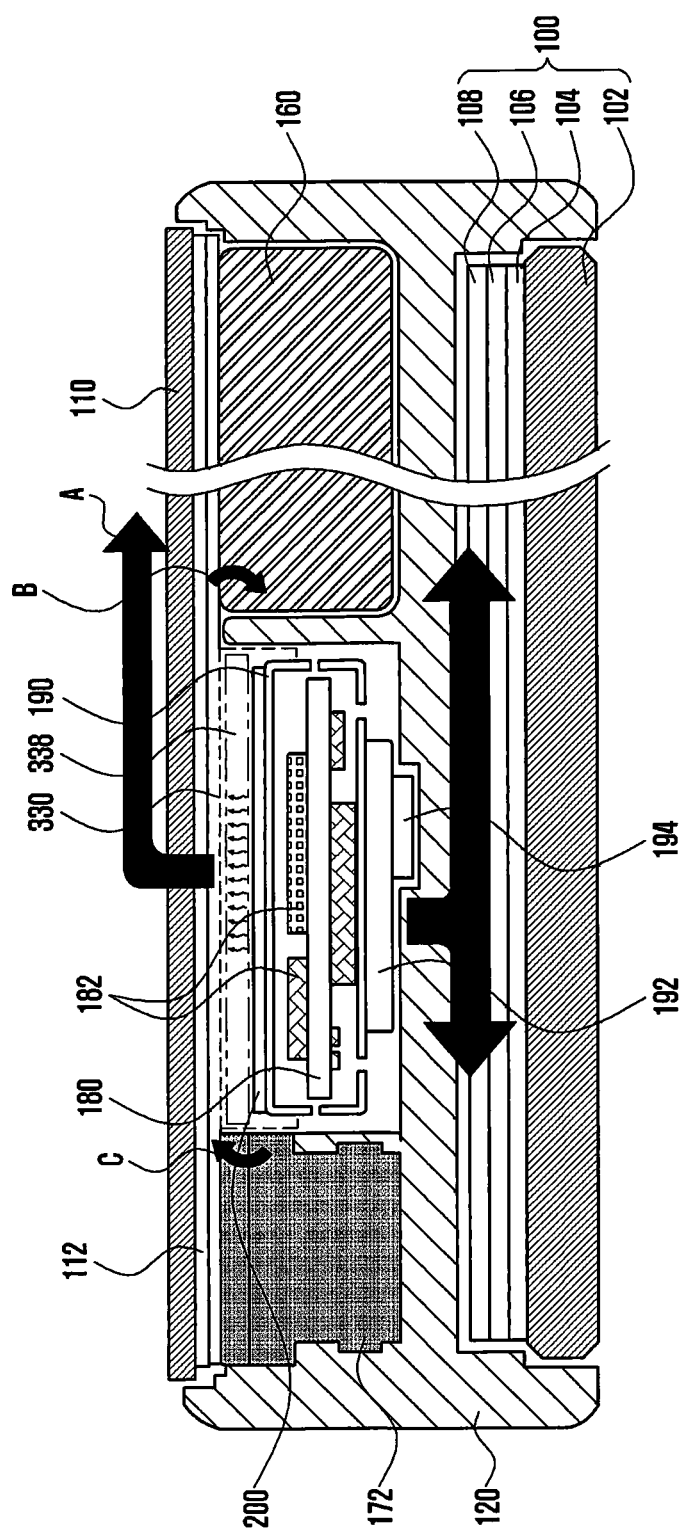
FIG. 9 is a cross-sectional view of a heat dissipation structure according to an embodiment of the present disclosure.

FIGS. 8A and 8B are top plan views of a heat dissipation structure and a frame of an electronic device according to an embodiment of the present disclosure. FIG. 9 is a cross-sectional view of a heat dissipation structure according to an embodiment of the present disclosure.

Referring to FIGS. 8 and 9, the heat dissipation apparatus includes a PCB 180, heat generating components 182 mounted on the PCB 180, and a device ejector frame 330 having a removed portion 336 corresponding to the area where the shield can 190 is positioned (indicated by dotted lines).

The device ejector frame 330 includes an upper frame 332 and a lower frame 334. Unlike the device ejector frame 230 of FIGS. 6 and 7, which includes the upper frame 232, the lower frame 234, and the link frame 236 vertically connecting the upper frame 232 and one side of the lower frame 234, the device ejector frame 330 of FIGS. 8 and 9 including the upper frame 332 and the lower frame 334 without the link frame 236 may be a two-piece component.

Similarly to the embodiment shown in FIGS. 6 and 7, the upper frame 332 may support a first camera, an illuminance sensor, and a proximity sensor arranged in the upper region of the front face of the terminal, and support a second camera, a flash, and a speaker arranged in the rear face. The lower frame 334 may support a home button, a menu button, and a back button arranged in the lower region of the terminal.

As shown in FIGS. 8A, 8A and 9, the removed portion 336 of the device ejector frame 330 may create an air volume space 338 corresponding to the size of the removed portion 336 between the shield can 190 and the cover glass 112.

As shown in FIG. 9, the air volume space 338 may block direct conduction (indicated by arrow A) of the heat generated by the heat generating components 182 mounted on the PCB 180, and heat radiation and convection may occur in the air volume space 338 (indicated by arrows B and C). The air volume space 338 may have a volume of, for example, 3.14 cc (twice that of the embodiment shown in FIG. 7), and the removed portion 336 may reduce the weight of the terminal in accordance with its size.

Figure 10:
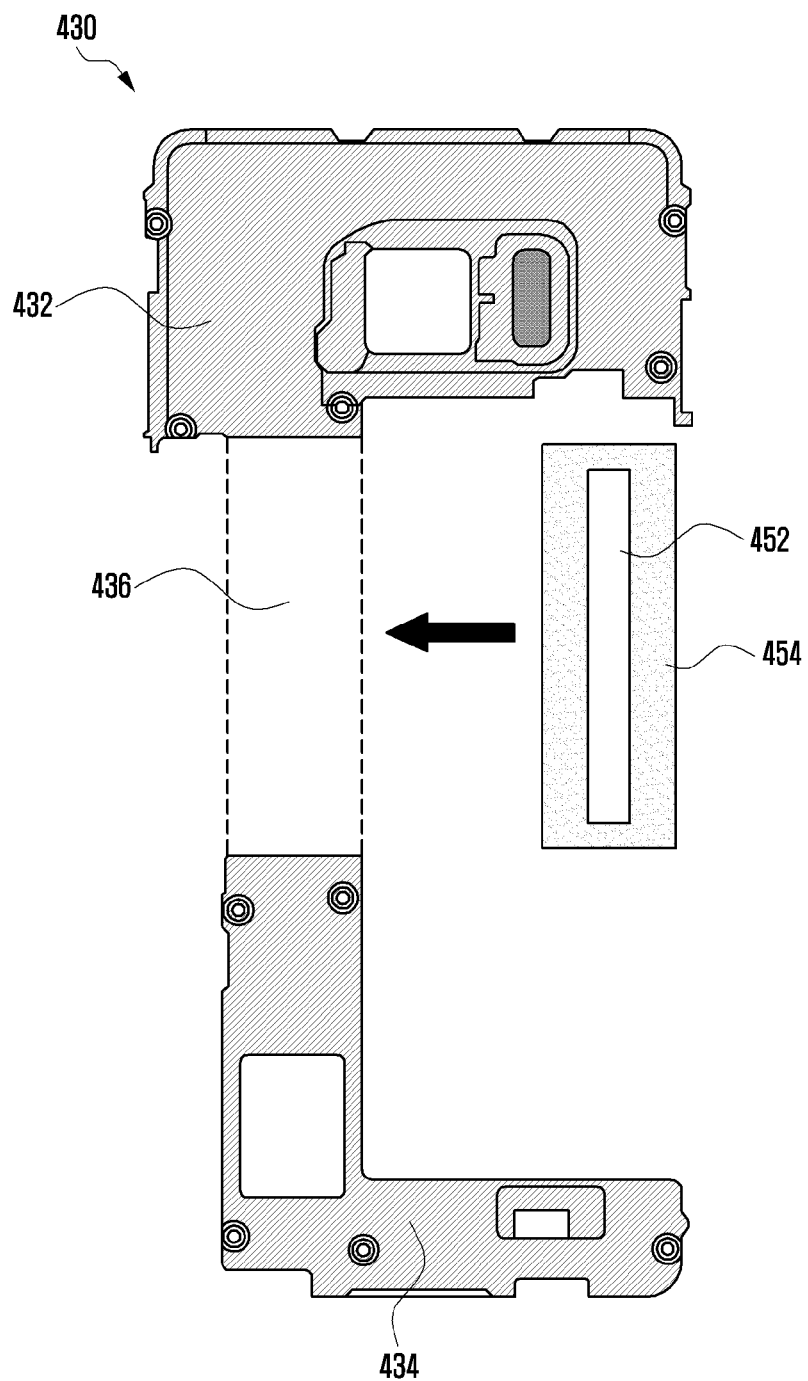
FIG. 10 is a top plan view of a frame of an electronic device according to an embodiment of the present disclosure.
Figure 11:
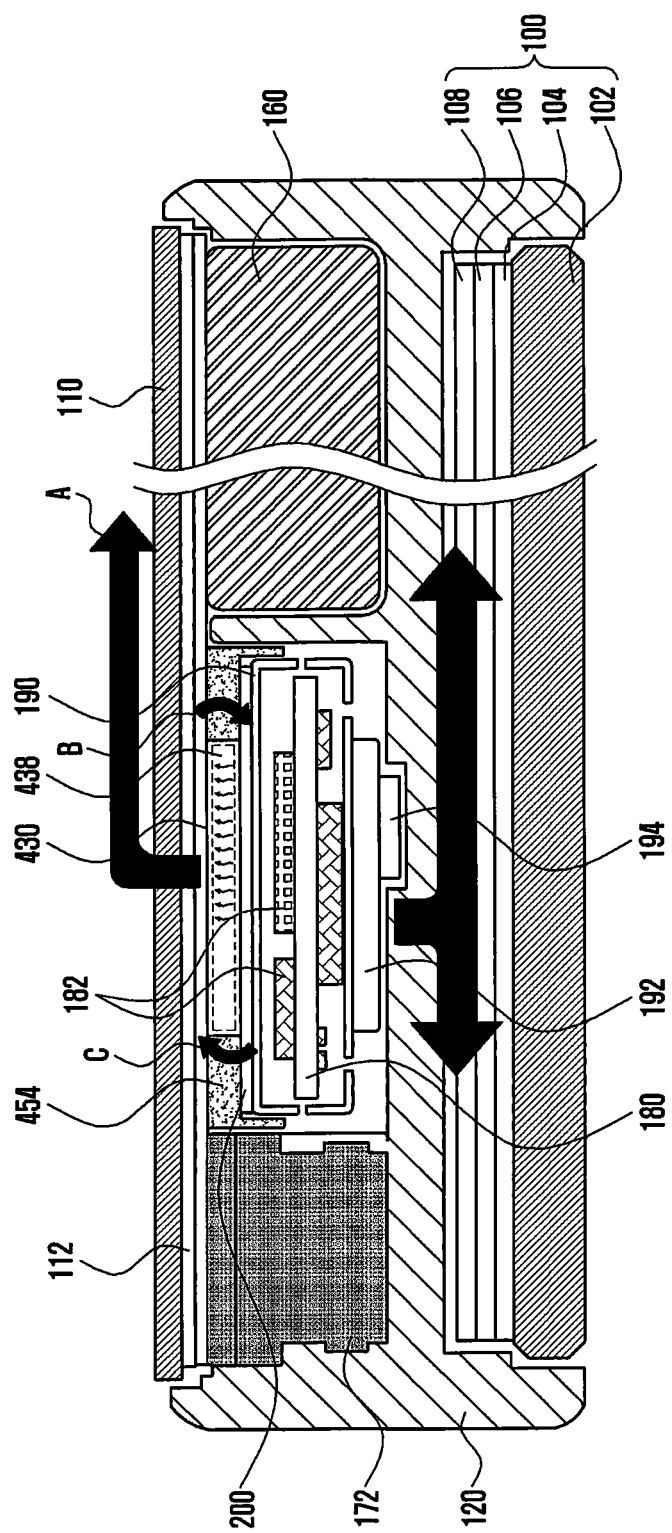
FIG. 11 is a cross-sectional view of a heat dissipation structure according to an embodiment of the present disclosure.

FIG. 10 is a top plan view of a frame of an electronic device according to an embodiment of the present disclosure. FIG. 11 is a cross-sectional view of a heat dissipation structure according to an embodiment of the present disclosure.

Referring to FIGS. 10 and 11, the heat dissipation apparatus includes a PCB 180, heat generating components 182 mounted on the PCB 180, and a device ejector frame 430 that includes a removed portion 436 corresponding to the area where the shield can 190 is positioned (indicated by dotted lines) and a rigid secondary member 454 having an opening 452 formed in the middle of the removed portion 436.

The device ejector frame 430 includes an upper frame 432, a lower frame 434, and a removed portion 436 between the upper frame 432 and the lower frame 434. Unlike the device ejector frame 230 of FIGS. 6 and 7, which includes the upper frame 232, the lower frame 234, and the link frame 236 vertically connecting the upper frame 232 and one side of the lower frame 234, the device ejector frame 430 of FIGS. 10 and 11 including the upper frame 432 and the lower frame 434 may be a two-piece component similarly to the device ejector frame 330 of FIGS. 8 and 9.

Similar to the embodiment of FIGS. 6 and 7, the upper frame 432 may support a first camera, an illuminance sensor, and a proximity sensor arranged in the upper region of the front face of the terminal, and support a second camera, a flash, and a speaker arranged in the rear face. The lower frame 434 may support a home button, a menu button, and a back button arranged in the lower region of the terminal.

As shown in FIGS. 10 and 11, the removed portion 436, upper frame 432 and lower frame 434 of the device ejector frame 330 may create an air volume space 438 corresponding to the size of the removed portion 436 between the shield can 190 and the cover glass 112. However, when the electronic device or terminal is folded or bent, the air volume space 438 may be decreased. To prevent the decrease in air volume space 438, the device ejector frame 430 may further include a rigid secondary member 454 having an opening 452 formed in the middle of the removed portion 436.

The rigid secondary member 454 may be made of a lightweight material having a desired level of rigidity and compactness. The rigid secondary member 454 may have a shape of a rectangular frame as shown in FIG. 10. Alternatively, the rigid secondary member 454 may have a shape of a bar connecting the upper frame 432 and the lower frame 434. Such a lightweight material may be a sponge. In this case, the rigid secondary member 454 may be attached to the shield can 190 so as to bypass the heat source.

As shown in FIG. 11, the air volume space 438 may block direct conduction (indicated by arrow A) of the heat generated by the heat generating components 182 mounted on the PCB 180, and heat radiation and convection may occur in the air volume space 438 (indicated by arrows B and C).

Although the air volume space 438 of FIG. 11 may be less than the air volume space 338 of FIG. 9 due to the rigid secondary member 454, it may reduce the weight of the terminal in accordance with the size of the opening 452.

Referring to FIG. 5, which depicts the path of heat conduction, in the heat dissipation apparatus of the present disclosure, the graphite heat diffusion sheet 202 and the antenna pattern of the combo coil FPCB 200 may diffuse the heat of the heating area 210 to different areas with a low temperature, thereby suppressing generation of a hot spot area. However, when the rate of thermal conduction from the hot spot area is low in comparison to the temperature rise in the hot spot area, it may not be possible to suppress hot spot generation. In addition, the cross-sectional structure for heat dissipation stacked on heat generating components may act as a medium that directly transfers the heat produced by the heat generating components 182 to the cross-sectional surface of the terminal (e.g. cover glass 112 of the back cover 110).

Figure 12A:
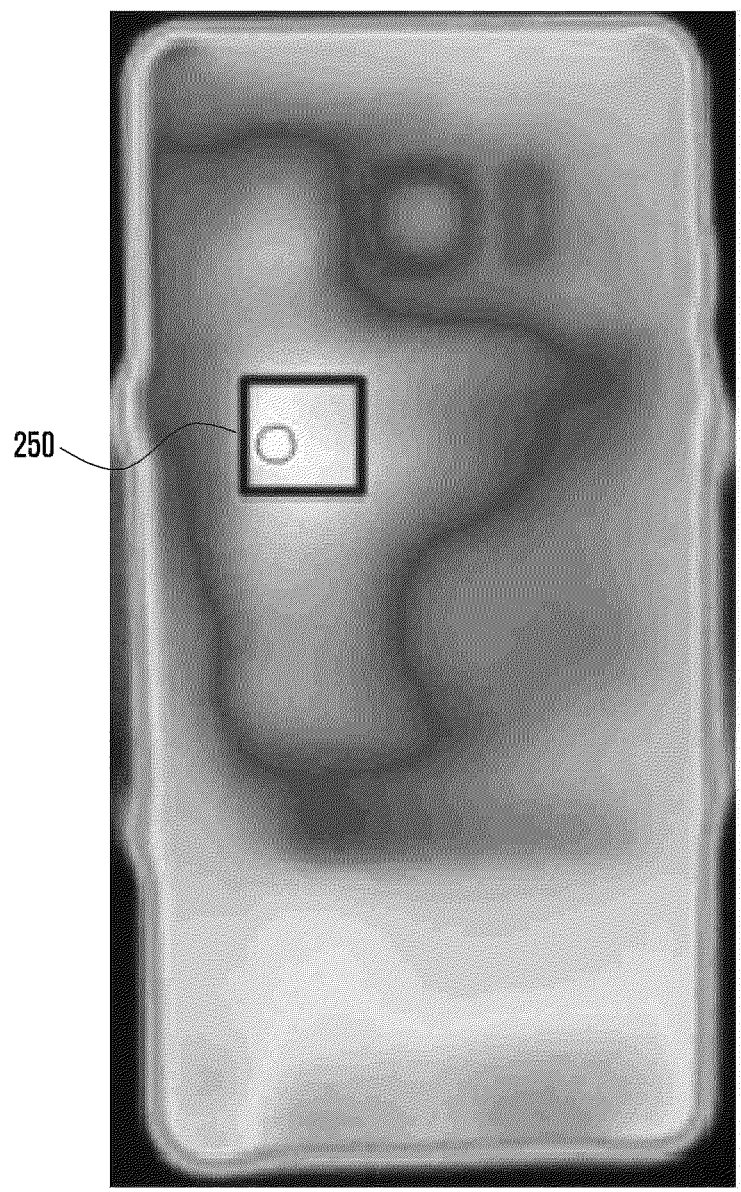
FIGS. 12A to 12C illustrate temperature distributions in different heat dissipation structures according to an embodiment of the present disclosure.
Figure 12B:
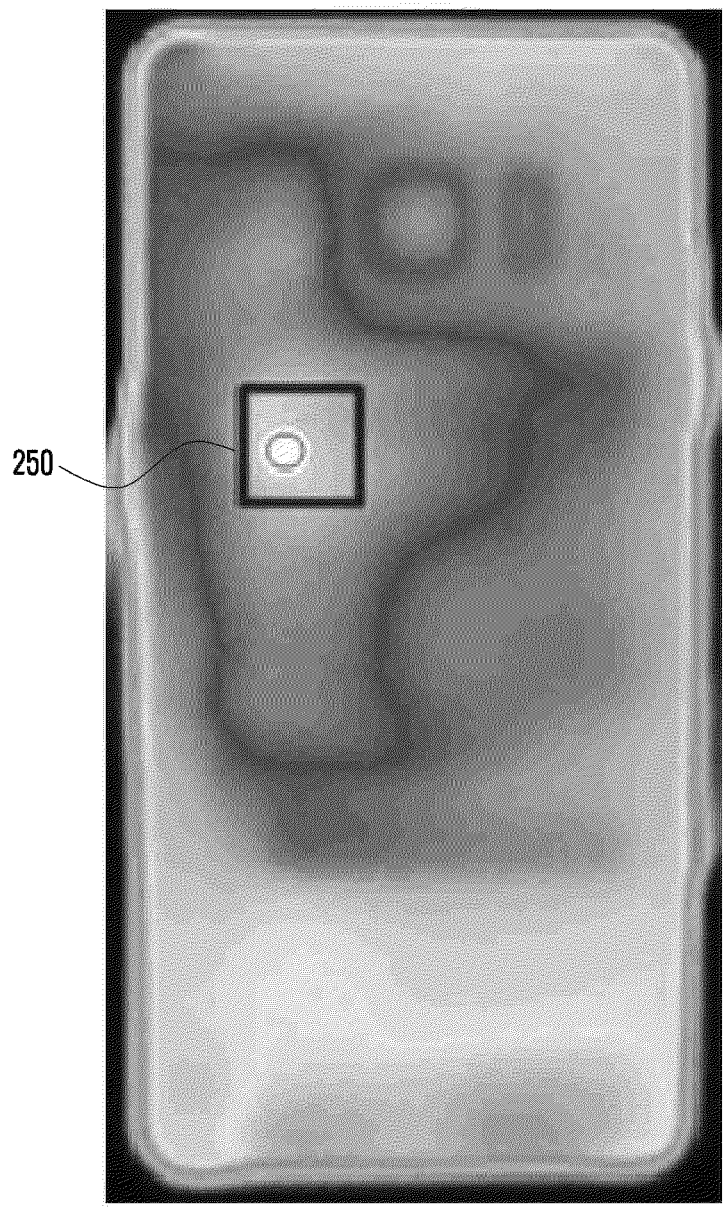
Figure 12C:
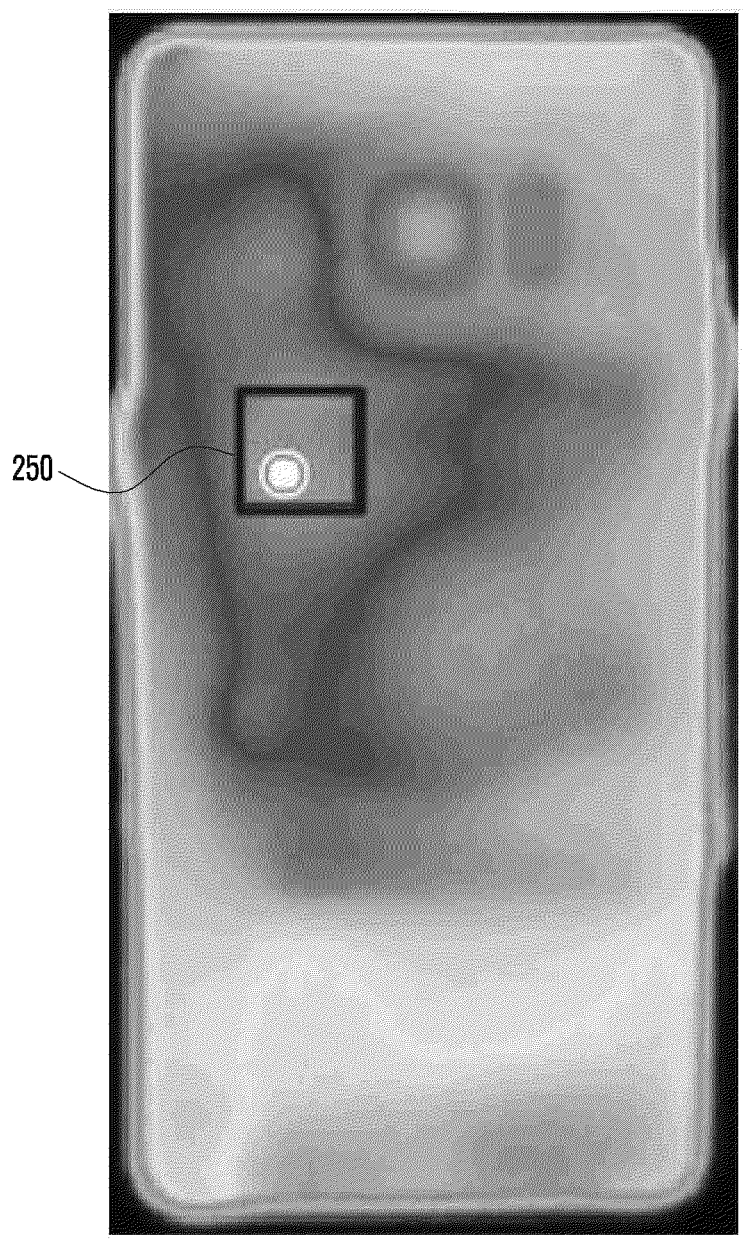
Figure 13A:
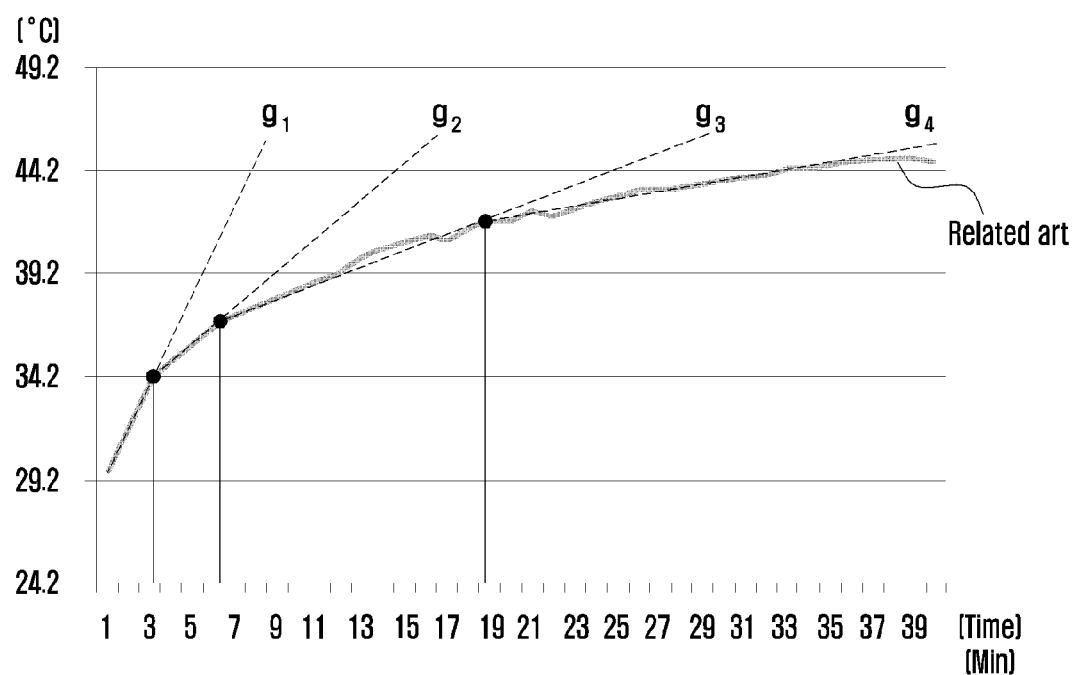
FIGS. 13A and 13B illustrate graphs of surface heating temperatures over time according to an embodiment of the present disclosure.
Figure 13B:
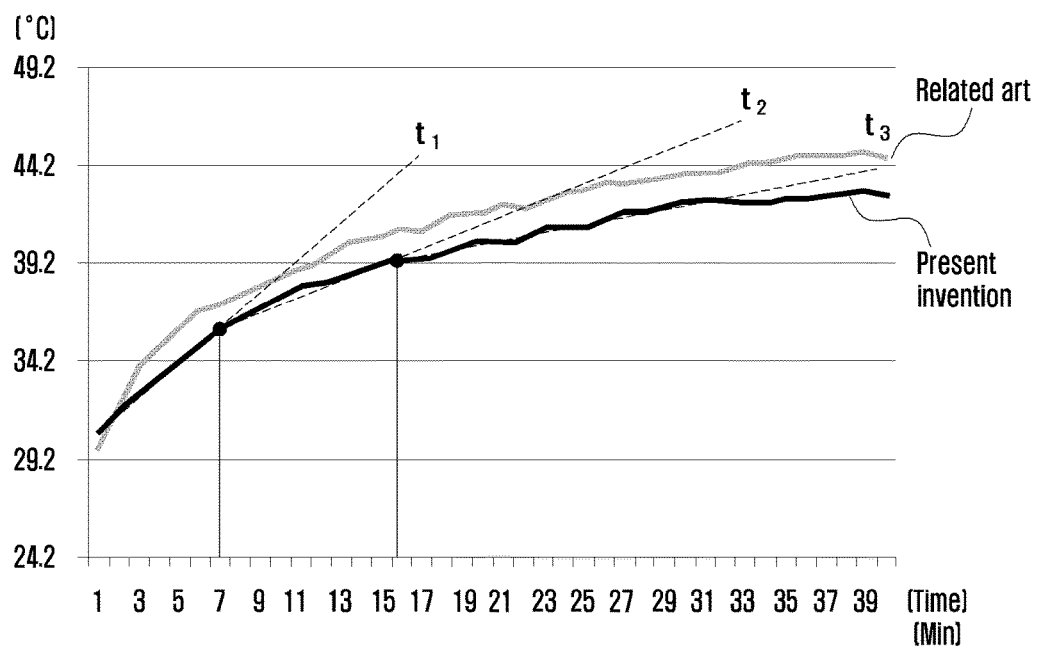

FIGS. 12A to 12C illustrate temperature distributions in different heat dissipation structures according to an embodiment of the present disclosure. FIGS. 13A and 13B illustrate graphs of surface heating temperatures over time according an embodiment of the present disclosure.

FIGS. 12A and 13A are related to the device ejector frame 230 including the upper frame 232, lower frame 234, and link frame 236 (as a single piece). FIG. 13A shows that the slope of the surface heating temperature at the hot spot 250 of the device ejector frame 230 varies in several stages (e.g. four slopes g1, g2, g3, g4). FIG. 13A also shows that the temperature at the hot spot rises to 38° C. (higher than human body temperature) in five to six minutes and subsequently rises to 44.8° C. The slope of the temperature rise varies in four stages because the shield can 190, the device ejector frame 130 made of plastic, the combo coil FPCB 200, and the cover glass 112 stacked on the hot spot of the heat generating components 182 may act as thermal conductors and thermal resistors for heat diffusion.

FIG. 12B is related to the device ejector frame 230 including the link frame 236 with the second opening 244 (the embodiment of FIGS. 6 and 7), and shows the result of measurements of the temperature with an air volume space of 1.57 cc in the second opening 244. The temperature was measured 20 minutes after starting an application placing a heavy computing load on the AP of the terminal. With the second opening 244 in the link frame 236 of the device ejector frame 230, the temperature of the hot spot rises to 43.8° C. through the effect of the air volume space 222 corresponding to the size of the second opening 244.

FIG. 12C is related to the device ejector frame 330 including the upper frame 332 and the lower frame 334 as two separate pieces (the embodiment of FIGS. 8 and 9), and shows the result of measurement of the temperature with an air volume space of 3.14 cc. The temperature of the hot spot rises to 42.8° C. through the effect of the air volume space 338 corresponding to the size of the removed portion 336 between the upper frame 332 and the lower frame 334 of the device ejector frame 330.

Referring to FIGS. 12B and 12C, the device ejector frame 230 with an opening in the middle configured as a single piece, according to an embodiment of the present disclosure, and the device ejector frame 330 including the upper frame 332 and the lower frame 334 as two separate pieces, according to another embodiment of the present disclosure, contribute to a significant reduction of the hot spot area.

In comparison to the existing configuration of the device ejector frame, the one-piece device ejector frame 230 with an opening lowers the hot spot temperature by 1° C., and the two-piece device ejector frame 330 lowers the hot spot temperature by 2° C.

These results may show that the surface temperature decreases with the air volume space. Many experiments performed thereafter have shown that the decrease in the surface temperature is not in direct proportion to the change in the air volume space. Specifically, it has been found that reduction of the surface temperature is most effective when the air volume space is directly above the heat source.

FIG. 13B illustrates a graph of the result of measurement of the surface temperature in the heat dissipation apparatus of the present disclosure over time. Here, the slope of the surface temperature in the heat dissipation apparatus may vary in three stages (e.g. t1, t2, t3). While FIG. 13A shows a sharp rise in the surface temperature (immediately after starting the application which places a heavy processing load on the AP as indicated by g1), there is no sharp rise in the surface temperature for the heat dissipation apparatus of the present disclosure in the graph of FIG. 13B. This may indicate that the air volume space suppresses a sharp rise in the surface temperature.

The three-stage slope changes may be caused by removal of the device ejector frame 130 from among the shield can 190, the device ejector frame 130, the combo coil FPCB 200 and the cover glass 112 stacked in sequence from the heat source. A comparison between the above slopes in the temperature rise may reveal that the slope t1 is less than the slopes g1 and g2 and greater than the slope g3.

A description is provided below for reduction of heat generation in accordance with a variation in the air volume space with reference to FIGS. 14A and 14B, which illustrate variations in the cross-sectional area of the hot spot corresponding to changes in the air volume formed by the heat dissipation structures of the present disclosure.

Figure 14A:
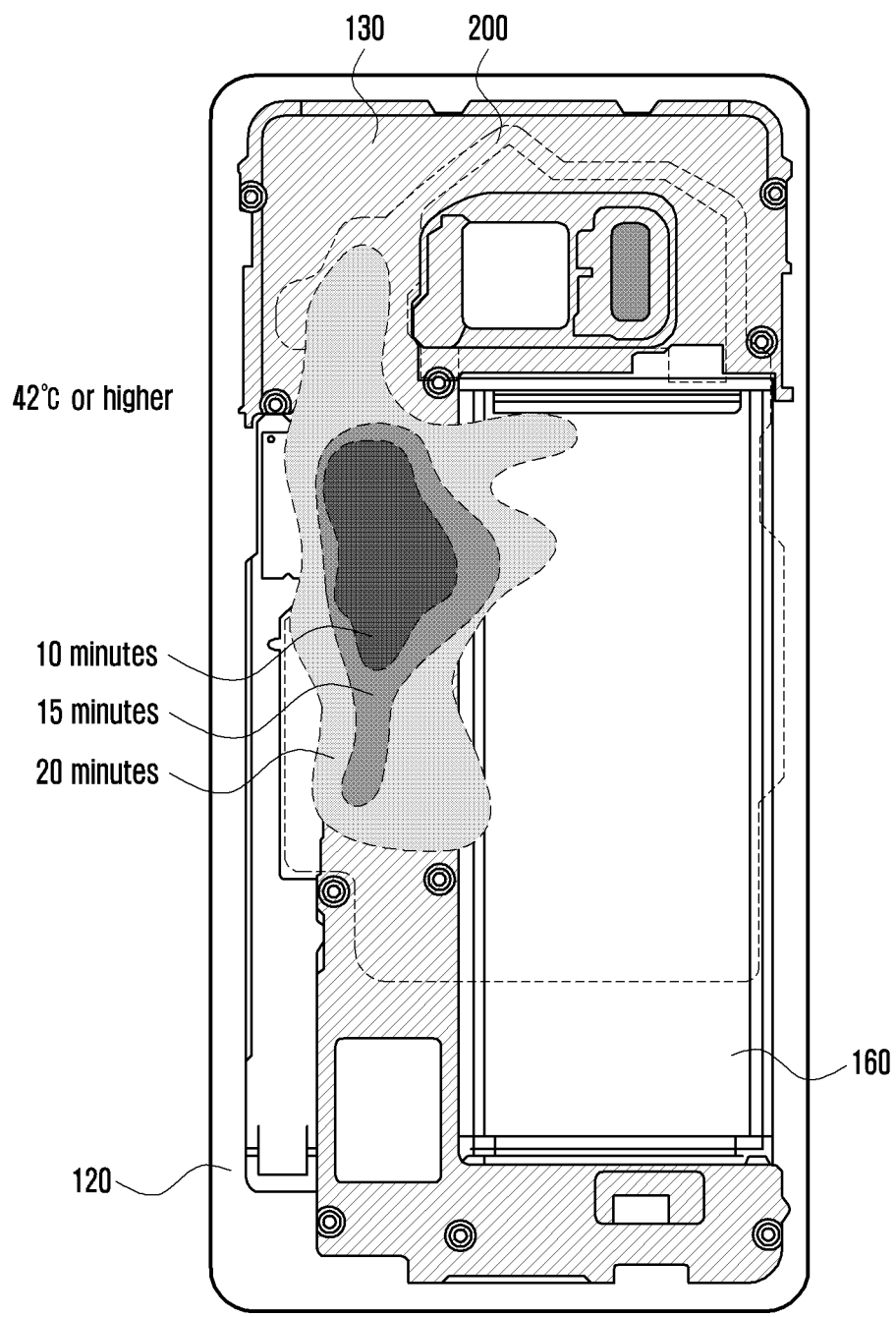
FIGS. 14A and 14B illustrate variations in the cross-sectional area of a hot spot corresponding to changes in air volume formed by heat dissipation structures according to an embodiment of the present disclosure.
Figure 14B:
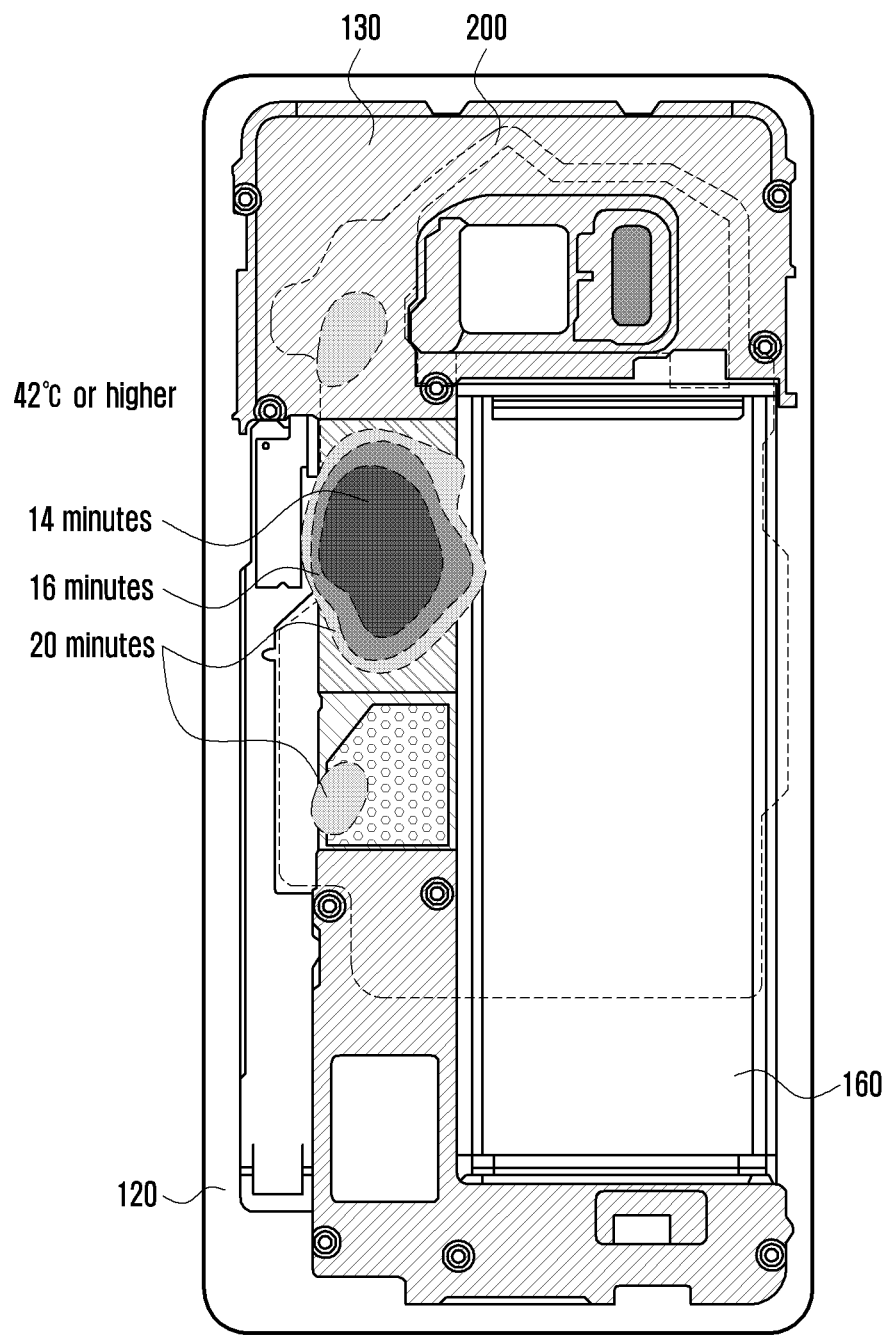

FIGS. 14A and 14B illustrate variations in the cross-sectional area of a hot spot corresponding to changes in air volume formed by heat dissipation structures according to an embodiment of the present disclosure.

FIG. 14A illustrates variations in the cross-sectional area of the hot spot over time for the device ejector frame 230 including the upper frame 232, lower frame 234, and link frame 236 as a single piece component. FIG. 14B illustrates variations in the cross-sectional area of the hot spot over time for the device ejector frame 330 including the upper frame 332 and lower frame 234 as a two-piece component. In FIGS. 14A and 14B, the hot spot refers to an area whose surface temperature is greater than or equal to a given temperature (e.g. 42° C.).

For the single-piece device ejector frame 230 of FIG. 14A, the temperature rises to 44.8° C. For the two-piece device ejector frame 330 of FIG. 14B, the temperature rises to 42.8° C. Variations in the cross-sectional area of the hot spot for the device ejector frame 230 are different from those for the device ejector frame 330. That is, the variation in the cross-sectional area of the hot spot in FIG. 14A is greater than that in FIG. 14B. It may be seen from variations in the cross-sectional area that the device ejector frame 330 of FIG. 14B decreases the expansion of the hot spot effectively.

It is not possible to expand the air volume space without limitation in the electronic device. The results of experiments reveal that although reduction of heat generation is not in direct proportion to the size of the air volume space, heat radiation and convection may be reduced when the air volume space is far from the heat generating components.

According to an embodiment of the present disclosure, a heat dissipation apparatus for an electronic device includes a battery area disposed at one portion to allow attachment of a battery pack, a heat generation body disposed at a different portion from that of the battery area and including a shield can and a PCB on which heat generating components are mounted, an internal support structure disposed in an area where the heat generation body is positioned, and a coil FPCB attached between the internal support structure and the shield can, wherein the internal support structure may include an air volume space that is configured to block conduction of heat produced by the heat generation body and generate thermal radiation and convection.

The internal support structure may be a device ejector frame, the air volume space may be formed between the shield can and a cover glass, and the coil FPCB may include a heat dissipation sheet and an antenna pattern.

The internal support structure may include an upper frame, a lower frame, and a link frame vertically connecting the upper frame and the lower frame, and the upper frame, lower frame, and link frame may be formed as a single piece.

The link frame may include an opening at a position corresponding to a heating area due to high-temperature heat produced by the heat generation body, and the PCB and the shield can exposed through the opening.

The air volume space may be formed between the shield can exposed through the opening and the cover glass.

The internal support structure may include an upper frame and a lower frame as two separate pieces.

The heating area due to high-temperature heat produced by the heat generation body may be positioned between the upper frame and the lower frame, and the PCB and the shield can exposed between the upper frame and the lower frame.

The air volume space may be formed between the shield can exposed between the upper frame and the lower frame, and the cover glass.

The internal support structure may include an upper frame and a lower frame as two separate pieces, and may further include a rigid secondary member between the upper frame and the lower frame.

The rigid secondary member may be made of a lightweight material with an opening in the middle. The rigid secondary member may be a sponge and may be attached so as not to be directly affected by heat from the heat generation body.

The air volume space may be formed by the opening of the rigid secondary member in between the shield can and the cover glass.

According to an embodiment of the present disclosure, an electronic device may have a heat dissipation apparatus. Here, the heat dissipation apparatus may include: a battery area disposed at one portion to allow attachment of a battery pack; a heat generation body disposed at a different portion from that of the battery area and including a shield can and a PCB on which heat generating components mounted; an internal support structure disposed in an area where the heat generation body is positioned; and a coil FPCB attached between the internal support structure and the shield can, wherein the internal support structure may be configured to reduce a hot spot area.

The internal support structure may include an upper frame, a lower frame, and a link frame vertically connecting the upper frame and the lower frame, and the upper frame, lower frame, and link frame may be configured as a single piece so as to form an air volume space.

The internal support structure may include an upper frame and a lower frame as two separate pieces so that an air volume space is formed between the upper frame and the lower frame.

The internal support structure may include an upper frame and a lower frame as two separate pieces, and may further include a rigid secondary member so that an air volume space is formed between the upper frame and the lower frame.

The rigid secondary member may be made of a lightweight material with an opening in the middle.

The air volume space may be configured to block direct conduction of heat produced by the heat generation body and generate thermal radiation and convection.

According to an embodiment of the present disclosure, an electronic device includes a housing including a first face and a second face facing the opposite direction of the first face, a touchscreen display exposed through at least a portion of the first face, a middle plate disposed between the touchscreen display and the second face, electronic components arranged between the middle plate and the second face and producing heat during operation, a thermally conductive sheet disposed between the middle plate and the second face to diffuse heat produced by the electronic components, and a printed circuit board (PCB) disposed between the middle plate and the thermally conductive sheet so as to partially overlap the thermally conductive sheet when viewed from above the second face, wherein at least one of a substance whose thermal conductivity is lower than that of the substrate of the PCB and air is contained between the electronic components and the thermally conductive sheet.

According to an embodiment of the present disclosure, forming an opening in the device ejector frame serving as a support structure for stacking the coil FPCB or realizing a two-piece plastic frame configuration by removing a portion of the device ejector frame may reduce the weight of the terminal (e.g. weight reduction by 1 gram) and may provide an air volume space. This air volume space may reduce expansion of a hot spot area to lower the temperature of the hot spot (e.g. temperature drop by 1 to 2° C.), enhancing heat dissipation performance.

Hereinabove, certain embodiments of the present disclosure have been shown and described for the purpose of illustration without limiting the subject matter of the present disclosure. It should be understood by those skilled in the art that many variations and modifications of the method and apparatus described herein fall within the spirit and scope of the present disclosure, as defined in the appended claims and their equivalents.

What is claimed is:

1. A heat dissipation apparatus for an electronic device, comprising:
   a battery area accommodating a battery;
   a heat generation body including:
   heat generating components mounted on a PCB, and
   a shield can, the PCB and the mounted heat generated components are embedded in the shield can;
   an internal support structure disposed adjacent to the heat generation body, the internal support structure includes a cut-out that forms the battery area; and
   a coil FPCB attached between the internal support structure and the shield can, wherein the internal support structure includes an air volume space configured to block conduction of heat produced by the heat generation body that causes thermal radiation and convection.

2. The heat dissipation apparatus of claim 1, wherein the internal support structure comprises a device ejector frame, and wherein the air volume space is formed between the shield can and a cover glass.

3. The heat dissipation apparatus of claim 1, wherein the coil FPCB includes a heat dissipation sheet and an antenna pattern.

4. The heat dissipation apparatus of claim 1, wherein the internal support structure comprises an upper frame, a link frame, and a lower frame connected in-line and formed as a single piece.

5. The heat dissipation apparatus of claim 4, wherein the link frame includes an opening at a position corresponding to a heating area produced by the heat generation body, and wherein the PCB and the shield can are exposed through the opening.

6. The heat dissipation apparatus of claim 5, wherein the air volume space is formed between a cover glass and the shield can exposed through the opening.

7. The heat dissipation apparatus of claim 1, wherein the internal support structure comprises an upper frame and a lower frame as two separate pieces.

8. The heat dissipation apparatus of claim 7, wherein a heating area produced by the heat generation body is present between the upper frame and the lower frame, and wherein the PCB and the shield can are exposed between the upper frame and the lower frame.

9. The heat dissipation apparatus of claim 8, wherein the air volume space is formed between a cover glass and the shield can exposed between the upper frame and the lower frame.

10. The heat dissipation apparatus of claim 7, wherein the internal support structure further comprises a rigid secondary member between the upper frame and the lower frame.

11. The heat dissipation apparatus of claim 10, wherein the rigid secondary member is made of a lightweight material with an opening in a middle of the rigid secondary member.

12. The heat dissipation apparatus of claim 11, wherein the air volume space is formed by the opening of the rigid secondary member in between the shield can and a cover glass.

13. The heat dissipation apparatus of claim 10, wherein the rigid secondary member is a sponge and is attached so as to not be directly affected by the heat from the heat generation body.

14. An electronic device including a heat dissipation apparatus, wherein the heat dissipation apparatus comprises:
a battery area accommodating a battery;
a heat generation body including:
heat generating components mounted on a PCB, and
a shield can, the PCB and the mounted heat generated components are embedded in the shield can;
an internal support structure disposed adjacent to the heat generation body, the internal support structure includes a cut-out that forms the battery area; and
a coil FPCB attached between the internal support structure and the shield can, wherein the internal support structure is configured to reduce a temperature and/or a size of a hot spot area.

15. The electronic device of claim 14, wherein the internal support structure comprises an upper frame, a link frame, and a lower frame connected in-line and formed as a single piece so as to form an air volume space within the internal support structure.

16. The electronic device of claim 15, wherein the air volume space is configured to block direct conduction of heat produced by the heat generation body that causes thermal radiation and convection.

17. The electronic device of claim 14, wherein the internal support structure comprises an upper frame and a lower frame as two separate pieces so that an air volume space is formed between the upper frame and the lower frame.

18. The electronic device of claim 17, wherein the internal support structure further comprises a rigid secondary member formed between the upper frame and the lower frame, the air volume space is formed in the rigid secondary member.

19. The electronic device of claim 18, wherein the rigid secondary member is made of a lightweight material with an opening in a middle of the rigid secondary member, the air volume space is formed by the opening of the rigid secondary member.

20. The electronic device of claim 17, wherein the air volume space is configured to block direct conduction of heat produced by the heat generation body that causes thermal radiation and convection.

* * * * *